United States Patent [19]

Bassett et al.

[11] Patent Number: 4,878,209
[45] Date of Patent: Oct. 31, 1989

[54] MACRO PERFORMANCE TEST

[75] Inventors: Robert W. Bassett, Essex Junction; William R. Griffin, Shelburne; Susan A. Murphy, South Burlington; John G. Petrovick, Jr., Colchester; James R. Varner, Essex Junction, all of Vt.; Dennis R. Whittaker, Fairfax, Va.

[73] Assignee: International Business Machines Corporation, Armonk, N.Y.

[21] Appl. No.: 169,544

[22] Filed: Mar. 17, 1988

[51] Int. Cl.[4] .................. G04F 8/00; G01R 15/12; G06F 11/14
[52] U.S. Cl. ..................... 368/113; 324/73 AT; 371/22.1
[58] Field of Search ............... 368/113–120; 324/73 R, 73 AT; 371/15, 21, 25; 364/569

[56] References Cited

U.S. PATENT DOCUMENTS

| 3,961,251 | 6/1976 | Hurley et al. | 324/73 AT |
|---|---|---|---|
| 3,961,252 | 6/1976 | Eichelberger | 371/21 |
| 3,961,254 | 6/1976 | Cavaliere et al. | 324/73 AT |
| 4,058,767 | 11/1977 | Muehldorf et al. | 324/73 R |
| 4,225,957 | 9/1980 | Doty, Jr. et al. | 371/15 |
| 4,332,028 | 5/1982 | Joccotton et al. | 371/21 |
| 4,461,000 | 7/1984 | Young | 371/21 |
| 4,481,627 | 11/1984 | Beauchesne et al. | 371/21 |
| 4,482,953 | 11/1984 | Burke | 364/200 |
| 4,503,387 | 3/1985 | Rutledge et al. | 524/73 R |
| 4,510,603 | 4/1985 | Catiller | 371/21 |
| 4,513,418 | 4/1985 | Bardell, Jr. et al. | 271/25 |
| 4,608,669 | 8/1986 | Klara et al. | 371/21 |

Primary Examiner—Vit W. Miska
Attorney, Agent, or Firm—Sughrue, Mion, Zinn, Macpeak, and Seas

[57] ABSTRACT

An apparatus and method for testing an access time of a macro embedded in a LSI chip. The apparatus includes a logical gate connected to the output latches of the macro, thereby controlling the access time of the macro, and a test latch for determining an on-chip delay time between a test signal for enabling the output latches and an input signal for enabling the macro. The method includes the steps of determining the on-chip delay time between the test signal and the input signal, thereby allowing the test signal to be synchronized with the input signal, supplying the synchronized test signal to the output latches for a manufacturer specified macro access time, and testing the latched output data from the macro.

14 Claims, 2 Drawing Sheets

MACRO PERFORMANCE TEST

FIELD OF THE INVENTION

The invention relates in general to large scale integrated (LSI) chips having macros, arrays and similar elements embedded therein. More particularly, the invention relates to an apparatus and method for accurately testing the access time of such embedded elements.

BACKGROUND OF THE INVENTION

RAM macros and the like which are embedded within LSI chips are necessarily surrounded by intervening circuitry including, for example, logic elements, and input/output chip interfaces. As a result, the embedded macros are not directly accessible from the input and output terminals of the chip. The intervening circuitry causes on-chip time delays to be associated with input and output signals of the chip. These delays prohibit accurate timing measurement between, for example, macro-enable signals and test input/output signals during a macro performance test, since the associated time delay for a given signal is unknown.

Various methods and devices exist which compensate for the on-chip time delays. These macro performance test methods and devices usually include complicated elements which bypass the intervening circuitry so that the macro is directly accessible from primary inputs.

U.S. Pat. No. 3,961,251 discloses a large scale integrated chip or semiconductor device for testing embedded arrays. The array includes address gates, data-in gates and data-out gates, and the device includes wiring that skirts the logic circuitry of the device, thereby allowing direct access from the primary input to the array.

U.S. Pat. No. 3,961,254 discloses a semiconductor device for testing embedded memory arrays. The device includes means for introducing information directly into the address register and data register from primary inputs, thereby bypassing the associated logic circuitry. The device further includes means which inhibit the associated logic circuitry during the testing mode. The information scanned into the registers is scanned out to determine whether there is a defect in the registers.

U.S. Pat. No. 4,481,627 discloses a method for testing memory arrays embedded within electronic assemblies. More particularly, the method includes isolating the embedded memory from other logic elements, and then testing the embedded memory array with a memory test subsystem.

In addition, there exist various scanning, recirculating and comparing methods for determining defective memory arrays and macros.

U.S. Pat. No. 4,332,028 discloses a method and device for measuring the memory address access time (AAT) of RAM or ROS memories by utilizing a data recirculation technique. The recirculation technique includes measuring the oscillation frequency of the memory, and then determining the required address access time.

U.S. Pat. No. 3,961,252 discloses a semiconductor device for testing embedded memory arrays. In the device, address and data registers are converted to counters by the addition of an EXCLUSIVE OR circuit. The device further includes a feedback circuit for recirculating the counter outputs to address and data register inputs.

U.S. Pat. No. 4,510,603 discloses a system for testing the access time of a ROM semiconductor memory. The system includes means for splitting the output data of the memory into two paths. One path is used to temporarily hold the memory output data for a specified time interval after which it is compared with the same memory output data on the second path. If the two paths do not contain the same memory output data, a comparator circuit generates an error signal.

U.S. Pat. No. 4,058,767 discloses a device for determining the AC or switching delay behavior of an LSI circuit. The device measures the signal propagation along different circuit paths to determine the AC characteristics.

U.S. Pat. No. 4,503,387 discloses a test for the AC characteristics of the input and output circuitry of programmable arrays independent of the AND or OR matrices. The test includes disabling the AND matrices, and connecting the true and complement outputs of all of the input buffers to each of the output buffers.

U.S. Pat. No. 4,225,957 discloses a testable LSI chip having macros embedded therein. The chip includes connecting the macros so that the total chip can be tested by testing each macro individually.

U.S. Pat. No. 4,482,953 discloses a microprocessor having a programmable logic array (PLA). The PLA is operable for supplying a sequence of instructions which will test various elements in the microprocessor.

U.S. Pat. Nos. 4,461,000 and 4,513,418 are cited as further examples of methods and devices for determining defective LSI components.

As indicated above, many of the previous macro performance test methods and devices include complicated elements which are implemented on the macro. In addition, many of these test methods and apparatus limit the size or type of macro which can be tested.

SUMMARY OF THE INVENTION

Thus, it is an object of the present invention to provide a macro performance test method and apparatus in which only a slight internal modification to the macro is required, and which can be implemented for any size or type of macro.

The invention accomplishes these and other objects by providing an apparatus and method for accurately testing the access time of a macro embedded in an LSI chip. The apparatus includes logical gate means connected to the output data latch of the macro, thereby controlling the access time of the macro; and means for determining an on-chip delay time between a test signal and an input signal for enabling the macro, thereby allowing accurate timing measurement between the test signal and the input signal during a macro performance test. The method of the invention includes the steps of: generating an enabling signal for a macro output latch; determining an on-chip delay time between the output latch enabling signal and an input signal, thereby synchronizing the output latch enabling signal with the input signal; supplying the synchronized output latch enabling signal to the output latch for a period of time equal to the access time of the macro; and testing the latched output data from the macro.

DESCRIPTION OF THE PREFERRED EMBODIMENT

Figure 1:
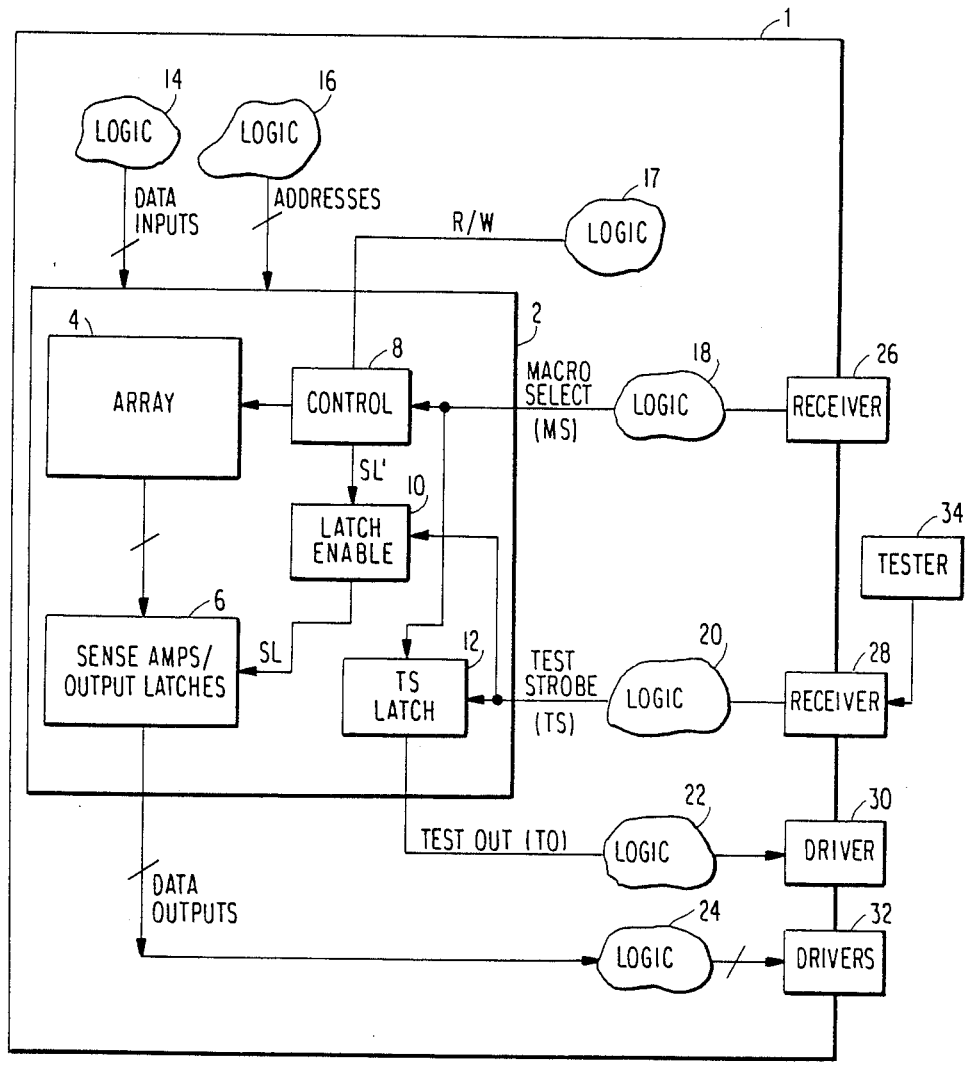
FIG. 1 is a simplified block diagram of a semiconductor device in accordance with the present invention.

FIG. 1 shows an LSI chip 1 having an embedded RAM macro 2 in accordance with the invention. The RAM macro 2 includes a memory array 4 output latches (sense amplifiers) 6, a control circuit 8, logical gate means 10 and a latch 12. The chip 1 further includes interfacing logic circuitry 14, 16, 17, 18. 20, 22 and 24 associated with data inputs, addresses. read/-write, macro-select, test strobe, test out and data output lines, respectively. The chip 1 further includes receivers 26 and 28, and drivers 30 and 32.

The read-write line is connected to the array 4 through control circuit 8, and serves to instruct the memory array 4 to perform either a read or write operation. The macro-select line extends from receiver 26 to control circuit 8 and to latch 12 through logic circuitry 18. A macro-select signal MS, supplied on the macro-select line, activates the memory array 4. In the embodiment shown in FIG. 1, memory array 4 is activated when control circuit 8 receives a "LOW" MS signal. The control circuit 8 which alternatively may be provided external to the memory array 4 as a single element, supplies a "HIGH" SL signal to logical gate means 10 in response to a "LOW" MS signal, and supplies a "LOW" SL signal in response to a "HIGH" MS signal. The test strobe line extends from receiver 28 to latch 12 and to logical gate means 10 through logic circuitry 20. The receiver 28 is adapted to receive a test strobe signal TS from a tester such as a Takeda Riken T3340. The test out line extends from latch 12 to driver 30 through logic circuitry 22. The data out lines extend from the output latches 6 to drivers 32 through logic 24.

The logical gate means 10 receives signals SL and TS as inputs, and supplies signal SL as an output to the output latches 6. The output latches 6 allow output data to be read out from memory array 4 when signal SL is "HIGH". The logical gate means 10 serves to control the output latches 6 in accordance with signal SL and signal TS. More specifically, logical gate means 10 is designed such that it will supply a "HIGH" SL signal (e.g. output latches 6 enabling signal) only when each of signals SL and TS is "HIGH". Accordingly, logical gate means 10 may be implemented with, for example, an AND gate. Thus, since output latches 6 will only be activated when signal SL is "HIGH", output data from memory array 4 cannot be latched through output latches 6 until each of signals SL and TS is "HIGH".

The latch 12 is designed so that it supplies signal MS to the test out line when test strobe TS is "HIGH". This can be accomplished through the use of for example, a clocked D flip-flop, with the signal TS serving as the clock, and signal MS serving as the input to the flip-flop 12.

The test operation of the invention will now be described with reference to the semiconductor device of FIG. 1 and the timing diagrams of FIGS. 2A–2C.

The test operation according to the invention includes determining the on-chip delay time T between signals MS and TS. Once the delay time between these signals is determined, it is then possible to verify the access performance of the memory array 4.

Figure 2A:
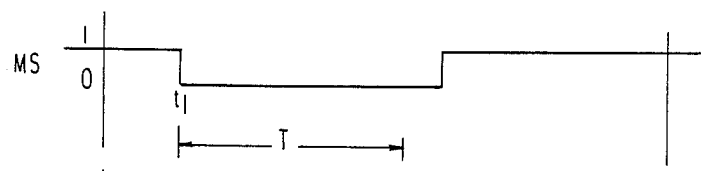
FIGS. 2A–2C are timing diagrams for explaining the testing operation of the semiconductor device of FIG. 1.

With reference to FIG. 2A. a pulse signal MS is supplied from receiver 26. The signal MS has a leading edge (e.g. a transition from 1 to 0) at a user specified time $t_1$ from origin $t_\phi$. The leading edge (LE) of signal MS will serve as a reference portion as will be described below. Since a "LOW" MS signal activates memory array 4, the array 4 becomes active at time $t_1$ plus the delay through logic circuitry 18. In addition, signal SL changes from a "LOW" value to a "HIGH" value.

Figure 2B:
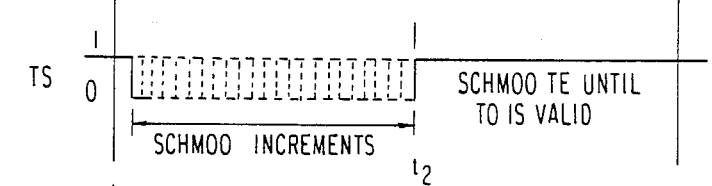
Figure 2C:
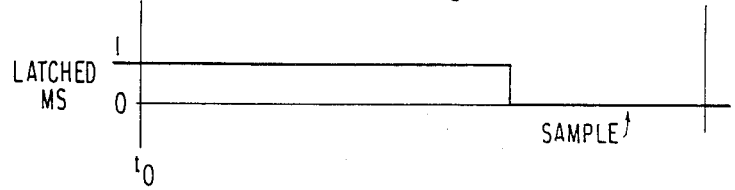

With reference to FIG. 2B. test strobe TS is supplied with respect to origin $t_\phi$ from receiver 28. More specifically, receiver 28 receives test strobe TS from the external tester 34 which is adapted to "schmoo" (see FIG. 2B) signal TS repeatedly until the arrival time of the leading edge of macro-select signal MS is measured at driver 30. Those skilled in the art will understand that the set up time of latch 12 would be included in the schmoo cycle. The schmoo cycle is accomplished by initializing the latch 12 to a "HIGH" value, and then observing the leading edge (LE) or transition of the latched MS signal. More specifically, since macro-select signal MS is supplied to D flip-flop 12, and since the test strobe TS serves as the clock for the flip-flop 12, the leading edge of macro-select signal MS will be "captured" or "copied" when the latched MS signal is observed to make a transition from "HIGH" to "LOW" (e.g. LE of MS). With reference to FIGS. 2A–2C the latched MS signal is shown making a transition (e.g. LE of MS captured) with a schmoo cycle ending at time $t_2$.

It should be understood that the measurement of time $t_2$ is independent of the time necessary for the latched MS signal to pass through logic 22, since the latched MS signal is merely sampled (e.g. measured) at driver 30 to determine whether the leading edge of signal MS was captured or copied during the schmoo cycle. For example, signal TS is first schmoo-ed for a specified time with respect to the origin $t_\phi$, with the trailing edge (TE) of signal TS being set at that specified time. The latched MS signal (e.g. output on test out line) is then observed to determine whether the leading edge of signal MS was captured. If the leading edge of signal MS was not captured, then the trailing edge of test strobe signal TS would be incremented (e.g. reset), and the operation repeated until the transition or reference portion of signal MS is observed on the test out line. When the latched MS signal is observed to make a transition (e.g. the leading edge of signal MS was captured by flip-flop 12). the trailing edge timing value of signal TS which was previously set for the schmoo cycle which produced the transition, is then stored. Thus, since the latched MS signal is observed only to ascertain whether or not a transition or reference portion has been captured, its timing is independent of the test operation.

The on-chip delay time T between signals MS and TS can now be calculated by subtracting the timing value of the leading edge of signal MS ($t_1$) from the stored timing value ($t_2$) of the trailing edge of signal TS.

At this point in the test operation, the following data is available:

(1) The MS signal timing with respect to the origin $t_\phi$:

(2) The TS signal timing with respect to origin $t_\phi$:

(3) The on-chip delay time between signals MS and TS (TE of TS minus the LE of MS): and (4) The manufacturer specified access time of the memory array $t_m$.

AC testing (Read Access Performance) can now be accomplished by adjusting the trailing edge of signal TS by the specified access time of the array.

For example, if time $t_1$ is 25 ns with respect to the origin $t_\phi$, and time $t_2$ is 40 ns with respect to the origin $t_\phi$. the resulting on-chip delay time T is equal to 15 ns (e.g. 40 ns-25 ns ). If the manufacturer's specified access time of the memory array 4 is, for example, 10 ns, a performance test of the access time of the memory array 4 can be run by supplying a "HIGH" TS signal for a time period P equal to the timing value with respect to origin $t_\phi$ of the trailing edge of signal TS plus the manufacturer specified access time $t_m$ of the memory array. In the above example, the period P for supplying a "HIGH" TS signal is equal to 50 ns (e.g. 40 ns+10 ns). By supplying a "HIGH" TS for the time period P, the access time of the memory array 4 can be tested since at time $t_2$, signals MS and TS are synchronized. More particularly, at time $t_2$, array 4 is activated since MS is "LOW", and output latches 6 are enabled since signals SL and TS are each "HIGH". When a "HIGH" TS signal is supplied for a time period which is equal to the stored leading edge of signal TS plus the manufacturer specified access time $t_m$, then the output latches 6 will allow data to be read out from memory array 4 for only time $t_m$. If the memory array is not operating within the manufacturer specified access time. (e.g. array 4 access time is slow), then data from array 4 will not be captured by the output latches 6 since signal TS becomes "LOW" after time $t_2$ plus $t_m$, thereby disabling the output latches 6. An operator will be able to verify whether the memory array 4 has a slow access time by observing the output data read out by array 4, and comparing the output data with reference data.

Thus, the present invention is able to isolate a macro from intervening logic circuitry so that an accurate timing measurement between a macro-enabling signal and a test input can be implemented during a macro performance test. By latching the data outputs from memory array 4 via signal TS, a programmer is able to control the access time of the macro. However, the on-chip delay time T between signals MS and TS caused by intervening logic circuitry prohibits accurate timing measurement of signals MS and TS during a performance test operation. The method and apparatus of the present invention is designed to measure the on-chip delay time T between signals TS and MS, thereby allowing accurate timings to be determined for access time testing of memory array 4.

Although a specific embodiment of the invention has been described, those skilled in the art will understand that various modifications may be made to the invention without departing from the spirit of the subject matter disclosed. For example, although the invention was described in connection with the testing of a RAM macro, those skilled in the art will understand that the invention may be implemented with any macro or design element which is embedded in random logic.

It is understood that the scope of the invention is limited only by the scope of the following claims.

We claim:

1. A semiconductor device having external chip circuitry, an array, means for receiving an input signal for enabling the array, and output data latches associated with the array, the device comprising:
   logical gate means connected to the output data latches, thereby controlling an access time of the array; and
   means for determining an on-chip delay time between a test signal and the input signal.

2. The device according to claim 1, wherein said determining means comprises a latch for receiving the input signal, and for outputting the input signal in response to the test signal.

3. The device according to claim 1, wherein said logical gate means supplies a control signal to the output latches in response to the input signal and the test signal.

4. The device according to claim 1, wherein said semiconductor device is a memory macro.

5. The device according to claim 2, wherein said determining means comprises a clocked D flip-flop having a data input and a clock input, the test signal being supplied to the clock input and the input signal being supplied to the data input.

6. The device according to claim 3, wherein said logical gate means comprises AND gate means for receiving the input signal and the test signal as inputs.

7. The device according to claim 4, further comprising an external tester means for supplying said test signal.

8. A macro embedded within an LSI chip, said macro comprising:
   means for receiving an enabling signal;
   means for receiving a test signal;
   memory array means for supplying data in response to the enabling signal:
   output latch means being operatively associated with said memory array for controlling output data from said memory array:
   logical gate means for controlling said output latch means, said logical gate means being operable for supplying a control signal to said output latch means in response to the test signal and the enabling signal; and
   test latch means for receiving the enabling signal and the test signal, said test latch means being operable for outputting the enabling signal in response to the test signal.

9. The macro according to claim 8, wherein said logical gate means is an AND gate.

10. The macro according to claim 8 wherein said test latch means is a clocked D flip-flop having a data input and a clock input, the test signal being supplied to the clock input and the enabling signal being supplied to the data input.

11. A method of testing an access time of a macro embedded within a semiconductor chip, the chip having circuitry, the macro having circuitry, means for receiving an input signal for enabling the macro, output data latches operatively associated with the macro means for receiving an input signal for enabling the output latches, and a specified access time, the method comprising the steps of:
   generating an enabling signal for the output latches;
   determining an on-chip delay time interval between the output latch enabling signal and the input signal for enabling the macro, thereby allowing the output latch enabling signal to be synchronized with the input signal for enabling the macro;
   supplying the synchronized output latch enabling signal to the output latches for a period of time equal to the specified access time, thereby enabling the array for the specified access time; and
   testing the latched output data from the macro.

12. The method according to claim 11, further comprising the steps of:

providing logical gate means for receiving the output latch enabling signal and the input signal for enabling the macro; and providing a latch for receiving the output latch enabling signal and the input signal for enabling the macro.

13. The method according to claim 11, wherein said determining step comprises:

providing a test latch in the macro for receiving the input signal for enabling the macro, and for outputting the input signal for enabling the macro in response to the output latch enabling signal;

supplying the input signal for enabling the macro to said test latch, said input signal having a transition portion at a specified time;

supplying the output latch enabling signal to said test latch for a predetermined time period, thereby activating said test latch for the predetermined time period;

repeating said output latch enabling signal supplying step with incrementally increased time periods only if the input signal transition portion is not outputted from said test latch; and storing the predetermined time period of the output latch enabling signal when the input signal transition is outputted from said test latch.

14. The method according to claim 13, further comprising the step of:

subtracting the specified time of the input signal transition from the stored time period.

* * * * *